US007079417B2

(12) United States Patent
Nam et al.

(10) Patent No.: US 7,079,417 B2
(45) Date of Patent: Jul. 18, 2006

(54) READ-WHILE-WRITE FLASH MEMORY DEVICES HAVING LOCAL ROW DECODER CIRCUITS ACTIVATED BY SEPARATE READ AND WRITE SIGNALS

(75) Inventors: Ga-pyo Nam, Gyeonggi-do (KR); Seung-Keun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 10/622,278

(22) Filed: Jul. 18, 2003

(65) Prior Publication Data

US 2004/0090825 A1    May 13, 2004

(30) Foreign Application Priority Data

Aug. 14, 2002    (KR) .................... 10-2002-0048045

(51) Int. Cl.
*G11C 16/04* (2006.01)
(52) U.S. Cl. ..................... 365/185.13; 365/185.11; 365/230.06; 365/189.01
(58) Field of Classification Search ........... 365/185.13, 365/185.11, 189.01, 185.33, 230.06, 63; 711/103
See application file for complete search history.

(56) References Cited

U.S. PATENT DOCUMENTS

| | | |
|---|---|---|
| 4,620,299 A | 10/1986 | Remington et al. |
| 4,661,724 A | 4/1987 | Remington et al. |
| 4,788,457 A | 11/1988 | Mashiko et al. |
| 4,932,000 A | 6/1990 | Kodama et al. |
| 5,077,495 A | 12/1991 | Torimaru et al. |
| 5,187,394 A | 2/1993 | Hoshizaki et al. |
| 5,265,062 A | 11/1993 | Lee |

(Continued)

FOREIGN PATENT DOCUMENTS

WO    WO 02/03388    1/2002

OTHER PUBLICATIONS

Atsumi et al. "A 3.3 V-only 16Mb Flash Memory with Row-Decoding Scheme" *IEEE Solid-State Circuits Conference Digest of Technical Papers* pp. 42-43 (1996).

(Continued)

*Primary Examiner*—David Lam
(74) *Attorney, Agent, or Firm*—Myers Bigel Sibley & Sajovec, PA

(57) ABSTRACT

A flash memory device can include a local row decoder circuit that is configured to drive word lines coupled to a bank of a flash memory responsive to separate read and write control signals provided thereto from outside the local row decoder circuit. Multiple local row decoder circuits can, therefore, be controlled by a single global row decoder circuit that provides the separate read and write control signals to each of the local row decoder circuits. By locating the combinatorial logic circuits used for decoding addresses in the global row decoder circuit, rather than in the local row decoder circuits, the local row decoder circuits may have reduced size, thereby allowing further reductions in the size of the flash memory device. For example, in some embodiments according to the invention, a NAND logic circuit used for address decoding is located in the global row decoder circuit, thereby allowing the area allocated to the local row decoder circuit to be reduced. Furthermore, because the may be many local row decoder circuits implemented in the flash memory device, the total size of the flash memory may be reduced.

26 Claims, 5 Drawing Sheets

U.S. PATENT DOCUMENTS

| | | | |
|---|---|---|---|
| 5,297,088 A | 3/1994 | Yamaguchi | |
| 5,347,493 A | 9/1994 | Pascucci | |
| 5,365,479 A | 11/1994 | Hoang et al. | |
| 5,392,253 A | 2/1995 | Atsumi et al. | |
| 5,394,375 A | 2/1995 | Iwashita | |
| 5,461,587 A | 10/1995 | Oh | |
| 5,513,146 A | 4/1996 | Atsumi et al. | |
| 5,563,842 A | 10/1996 | Challa | |
| 5,615,164 A | 3/1997 | Kirihata et al. | |
| 5,668,485 A | 9/1997 | Rountree | |
| 5,680,349 A | 10/1997 | Atsumi et al. | |
| 5,696,721 A | 12/1997 | McAdams et al. | |
| 5,719,818 A | 2/1998 | Tovim et al. | |
| 5,777,926 A | 7/1998 | Trinh et al. | |
| 5,796,656 A | 8/1998 | Kowshik et al. | |
| 5,808,482 A | 9/1998 | Rountree | |
| 5,812,459 A | 9/1998 | Atsumi et al. | |
| 5,886,923 A * | 3/1999 | Hung | 365/185.11 |
| 5,896,345 A | 4/1999 | Sohn | |
| 5,898,606 A * | 4/1999 | Kobayashi et al. | 365/63 |
| 5,912,857 A | 6/1999 | Kim et al. | |
| 5,933,388 A | 8/1999 | Choi | |
| 5,949,735 A | 9/1999 | Jeong | |
| 5,991,198 A | 11/1999 | Song et al. | |
| 5,999,479 A | 12/1999 | Park et al. | |
| 6,041,014 A | 3/2000 | Atsumi et al. | |
| 6,044,020 A | 3/2000 | Chung et al. | |
| 6,055,203 A | 4/2000 | Agarwal et al. | |
| 6,064,623 A | 5/2000 | Ha | |
| 6,069,837 A | 5/2000 | Micheloni et al. | |
| 6,088,267 A | 7/2000 | Atsumi et al. | |
| 6,111,795 A | 8/2000 | Takita et al. | |
| 6,118,726 A | 9/2000 | Ji et al. | |
| 6,122,200 A | 9/2000 | Campardo et al. | |
| 6,166,987 A | 12/2000 | Atsumi et al. | |
| 6,198,686 B1 | 3/2001 | Takita et al. | |
| 6,226,218 B1 | 5/2001 | Kim | |
| 6,233,198 B1 | 5/2001 | Choi | |
| 6,278,297 B1 | 8/2001 | DeSoto et al. | |
| 6,285,360 B1 | 9/2001 | Li | |
| 6,356,481 B1 | 3/2002 | Micheloni et al. | |
| 6,426,655 B1 | 7/2002 | DeSoto et al. | |
| 6,426,914 B1 | 7/2002 | Dennard et al. | |
| 6,507,508 B1 | 1/2003 | Hosono et al. | |
| 6,772,273 B1 * | 8/2004 | Tedrow et al. | 711/103 |
| 2002/0031038 A1 | 3/2002 | Yasuhiko et al. | |
| 2002/0067639 A1 | 6/2002 | Byeon et al. | |

OTHER PUBLICATIONS

European Search Report for European Application No. 03 01 7907 mailed on Dec. 20, 2005.

\* cited by examiner

READ-WHILE-WRITE FLASH MEMORY DEVICES HAVING LOCAL ROW DECODER CIRCUITS ACTIVATED BY SEPARATE READ AND WRITE SIGNALS

RELATED APPLICATION

The present invention claims priority to Korean Application No. 2002-0048045, which was filed Aug. 14, 2002 in the Korean Patent Office, the entire contents of which are incorporated herein by reference.

FIELD OF THE INVENTION

The invention generally relates to memory devices and, more particularly, to non-volatile memory devices.

BACKGROUND

Flash EPROM devices, commonly referred to as flash memory devices, typically include at least one memory array organized into rows and columns of flash memory cells. The array is typically partitioned into blocks, each of which is further divided into sectors. A row decoder and a column decoder are used to select a single row and at least one column of memory cells based upon an address applied to the flash memory device. Sense amplifiers are coupled to column lines corresponding to the columns of memory cells to amplify the voltage levels on the addressed column lines corresponding to the data values stored in the addressed flash memory cells. The particular implementations of known arrays and row/column decoders will not be discussed further herein.

Flash memory devices typically are capable of performing write operations whereby data can be "written to" (i.e., programmed to or erased from) memory cells selected by a write address applied to the row/column decoders during a write operation in the flash memory device. A read operation can be used to retrieve data previously written to memory cells selected by a read address applied to the row/column decoders during a read operation in the flash memory device.

Because write operations in a flash memory device typically take more time to perform than read operations, flash memory devices have been implemented as multi-bank structures so that a read operation can be performed in one of the banks while a write operation is simultaneously performed in another bank, which can provide a performance improvement over non-multi-bank structures. This type of multi-bank structure is sometimes referred to as "read-while-write" capability.

FIG. 1 is a block diagram illustrating a conventional multi-bank flash memory device 100 having read-while-write capability. In particular, the flash memory device 100 includes a plurality of banks of flash memory 110A–110C each of which is partitioned into multiple sectors. For example, the bank 110A is partitioned into sectors 115a–e, bank 110B is partitioned into sectors 115f–j, and the bank 110C is partitioned into sectors 115k–o. Each of the sectors 115 of the flash memory device 100 has an associated local decoder circuit 105. Each of the local decoder circuits 105 is coupled to the associated sector 115 via a plurality of word lines that can be used to access memory cells located within the sector 115.

The local decoder circuits 105 are activated responsive to address signals provided thereto that indicate which memory cells in the memory are to be accessed. For example, the address signals provided to the local decoder circuits 105 can indicate which of the banks 110A–110C, and which of the sectors 115a–o, and which of the plurality word lines corresponding to the memory cells identified by the address signals are to be accessed during a memory read or write operation. As discussed above, the multi-bank device 100 is capable of performing a read or write operation in one of the banks while another read or write operation is conducted in another bank simultaneously. For example, a write operation may be performed to memory cells in sector 115a while a read operation is simultaneously carried out in sector 115o.

FIG. 2 is a schematic diagram illustrating the local decoder circuit 105 shown in FIG. 1. The local decoder circuit 105 includes a combinatorial logic circuit 210 that further includes a NAND gate 201 that receives selected ones of the address signals that indicate which memory cells are to be accessed during a read or write operation. This is sometimes referred to as "decoding the address."

If the address signals provided to the combinatorial logic circuit 210 decodes to memory cells included in the sector associated with the local decoder circuit 105, the word line drive signal WL DRV coupled to a word line driver circuit 220 is pulled low when a select signal is asserted. The word line driver circuit 220 activates one of the word lines WL<7:0> based on a plurality of word line select signals PWL<7:0>. A decoder Enable signal can be used to provide a supply voltage $V_{PX}$ to the word line drive signal prior to or subsequent to a memory operation as a reset.

The word line select signals PWL<7:0> can be provided to the local decoder circuit 105 with the address signals, wherein one of the word line select signals PWL<7:0> is activated and the remainder of the word line select signals PWL<7:0> are deactivated. The portion of the word line driver circuit 220 that is responsive to the activated word line select signal PWL<7:0> activates the word line WL<7:0> that is coupled thereto. The local decoder circuit 105 also includes a reset circuit 230 that can insure that the remaining word lines WL (i.e., the word lines that are not selected) remain in the off state. The read or write operation can thereby be carried out to addresses memory cells.

Address decoding for flash memory devices is also discussed in U.S. Pat. No. 6,064,623 to Ha, and in U.S. Pat. No. 6,240,040 to Akaogi et al., and in U.S. Pat. No. 6,256,262 to Chen et al., the entire disclosures of which are hereby incorporated herein by reference in their entireties.

SUMMARY

Embodiments according to the invention can provide multi-bank flash memory devices with local row decoder circuits having separate read and write control lines provided thereto. Pursuant to these embodiments, a flash memory device can include a local row decoder circuit that is configured to drive word lines coupled to a bank of a flash memory responsive to separate read and write control signals provided thereto from outside the local row decoder circuit. Multiple local row decoder circuits can, therefore, be controlled by a single global row decoder circuit that provides the separate read and write control signals to each of the local row decoder circuits. By locating the combinatorial logic circuits used for decoding addresses in the global row decoder circuit, rather than in the local row decoder circuits, the local row decoder circuits may have reduced size, thereby allowing further reductions in the size of the flash memory device. For example, in some embodiments according to the invention, a NAND logic circuit used for address decoding is located in the global row decoder circuit, thereby allowing the area allocated to the local row decoder circuit to be reduced. Furthermore, because there may be many local row decoder circuits implemented in the flash memory device, the total size of the flash memory may be reduced.

In some embodiments according to the invention, the flash memory can include a global row decoder circuit that is coupled to the local row decoder circuit via the separate read and write control signals. The global row decoder circuit is configured to activate the separate read and write control signals based on an address provided to the global row decoder circuit that indicates memory cells associated with the address are accessed using the word lines.

In some embodiments according to the invention, the flash memory can include a second local row decoder circuit that is configured to drive a second bank of the flash memory, separate from the first bank, via second word lines that are separate from the first word lines. The second local row decoder circuit can be coupled to the global decoder circuit by the separate read and write control signals.

In some embodiments according to the invention, the global row decoder circuit is configured to activate the first and second local row decoder circuits using the separate read and write control signals. In some embodiments according to the invention, the local row decoder circuit and the global row decoder circuit are spaced apart within the flash memory.

In some embodiments according to the invention, the global row decoder circuit can include a read address decoder circuit that is configured to activate the read control signal coupled to the first and second separate banks based on a read address provided thereto. The global row decoder circuit can further include a write address decoder circuit that is configured to activate the write control signal coupled to the first and second separate banks based on a write address provided thereto.

In some embodiments according to the invention, the local row decoder circuit can include first and second bank select circuits configured to pass the separate read and write control signals to a plurality of word line drivers coupled to a sector within the bank. In some embodiments according to the invention, the first and second bank select circuits can include at least one totem-pole arrangement of first and second transistors. The first and second transistors can be made conductive to pass at least one of the separate read and write control signals to the plurality of word line drivers associated with the sector responsive to at least one select signal that indicates the local row decoder circuit is coupled to the bank that includes a memory location corresponding to a write or read address provided to the global decoder circuit.

In some embodiments according to the invention, the first and second bank select circuits can include at least one pass transistor that is configured to pass at least one of the separate read and write control signals to the plurality of word line drivers responsive to at least one bank select signal that indicates that the bank to which the local row decoder circuit is coupled includes a memory location corresponding to an address provided to the flash memory.

In some embodiments according to the invention, the global row decoder circuit can include first and second NAND combinatorial logic circuits or first and second NOR combinatorial logic circuits configured to provide the separate read and write control signals. In some embodiments according to the invention, the first and second NAND combinatorial logic circuits or the first and second NOR combinatorial logic circuits are configured to activate responsive to a read address for a read operation or a write address for a write operation respectively.

In some embodiments according to the invention, the flash memory device can further include a second bank of the flash memory that is configured to perform a read operation addressed thereto via a second local row decoder circuit simultaneous with the write operation. In some embodiments according to the invention, the flash memory has read-while-write capability that can include an ability to perform a write operation in the first bank of the flash memory via the first local row decoder circuit while simultaneously performing a read operation in a second bank of the flash memory via another local row decoder circuit.

In some embodiments according to the invention, the flash memory has read-while-write capability that can include an ability to perform a first read or write operation in a first sector of the bank while simultaneously performing a second read or write operation in a second sector of the bank that is separate from the first sector via another local row decoder circuit.

DESCRIPTION OF EMBODIMENTS ACCORDING TO THE INVENTION

The invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be understood that although the terms first and second are used herein to describe various elements, the elements are not limited by these terms. These terms are used, for example, to distinguish one element from another element. Thus, a first element discussed below could be termed a second element, and similarly, a second element may be termed a first element without departing from the teachings of this disclosure.

It will also be understood that when an element such as a circuit, is referred to as being "coupled" to another element, it can be directly coupled to the other element or intervening elements may also be present. The terminology used herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Unless otherwise defined, all terms used herein are to have their common meaning, or in the case of technical and scientific terms, to have the meaning that is commonly understood by those of ordinary skill in the art to which this invention belongs.

Embodiments according to the invention can provide local row decoder circuits that are configured to drive word lines for associated sectors of the flash memory device. The local row decoder circuits can be activated by separate read and write control signals that are provided from outside the local row decoder circuit, such as from a global row decoder circuit. Multiple local row decoder circuits can, therefore, be controlled by a single global row decoder circuit that provides the separate read and write control signals to each of the local row decoder circuits under its control By locating the combinatorial logic circuits used for decoding addresses in the global row decoder circuit, rather than in the local row decoder circuits, the local row decoder circuits may occupy less area, thereby allowing further reductions in the size of the flash memory device.

Figure 1:
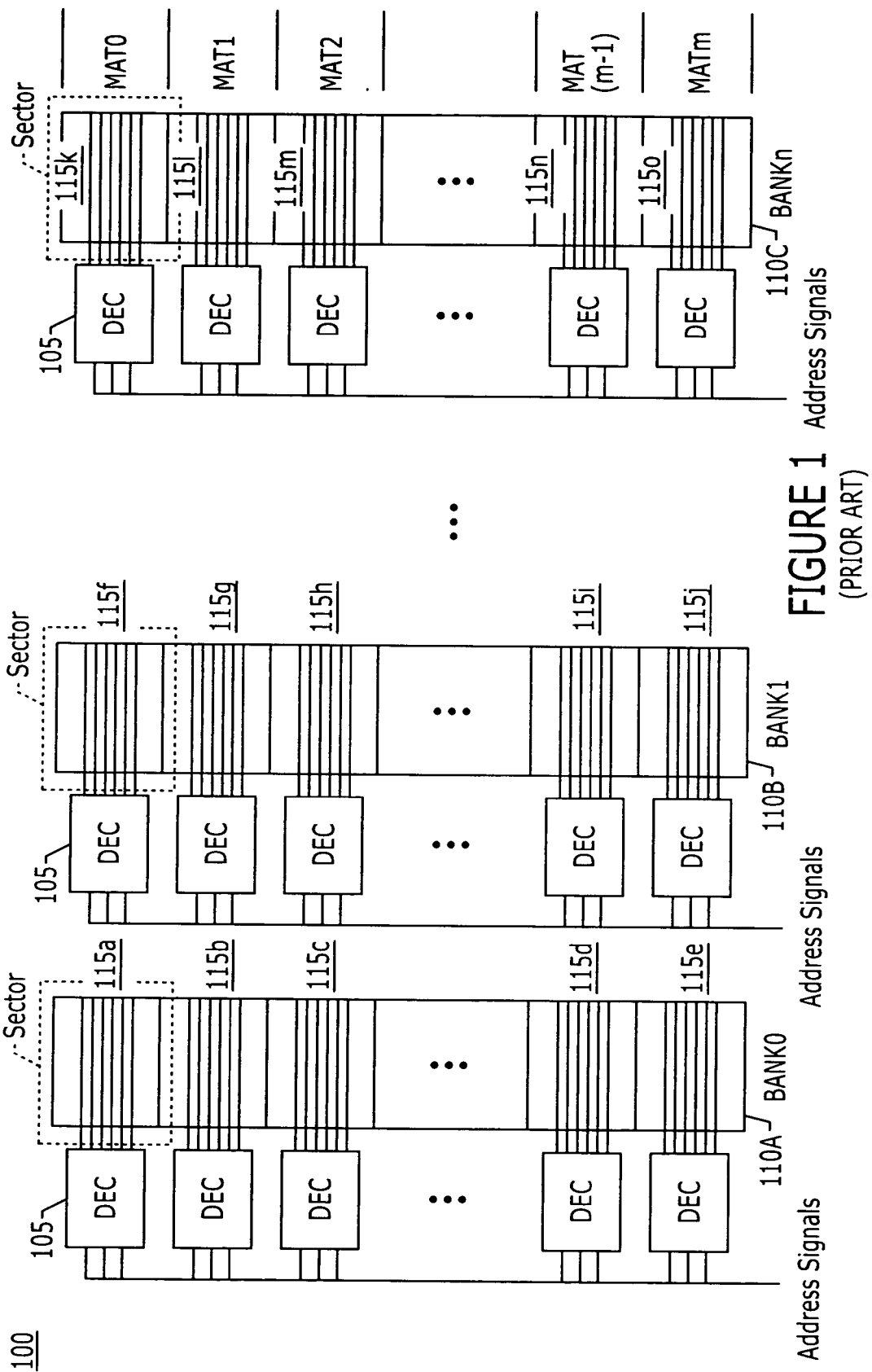
FIG. 1 is a block diagram that illustrates a conventional multi-bank flash memory device.
Figure 2:
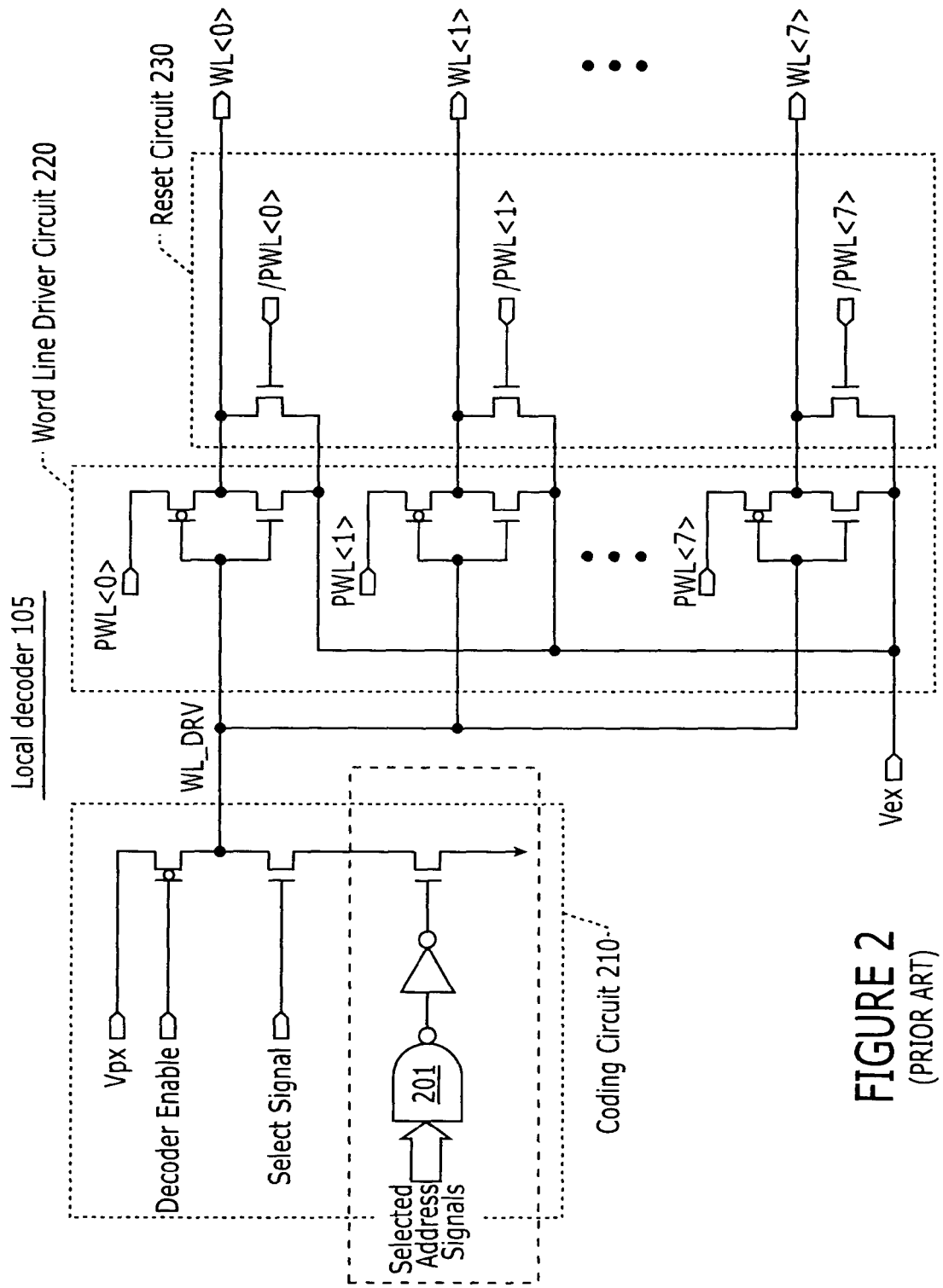
FIG. 2 is a schematic diagram that illustrates the conventional row decoder circuit shown in FIG. 1.
Figure 3:
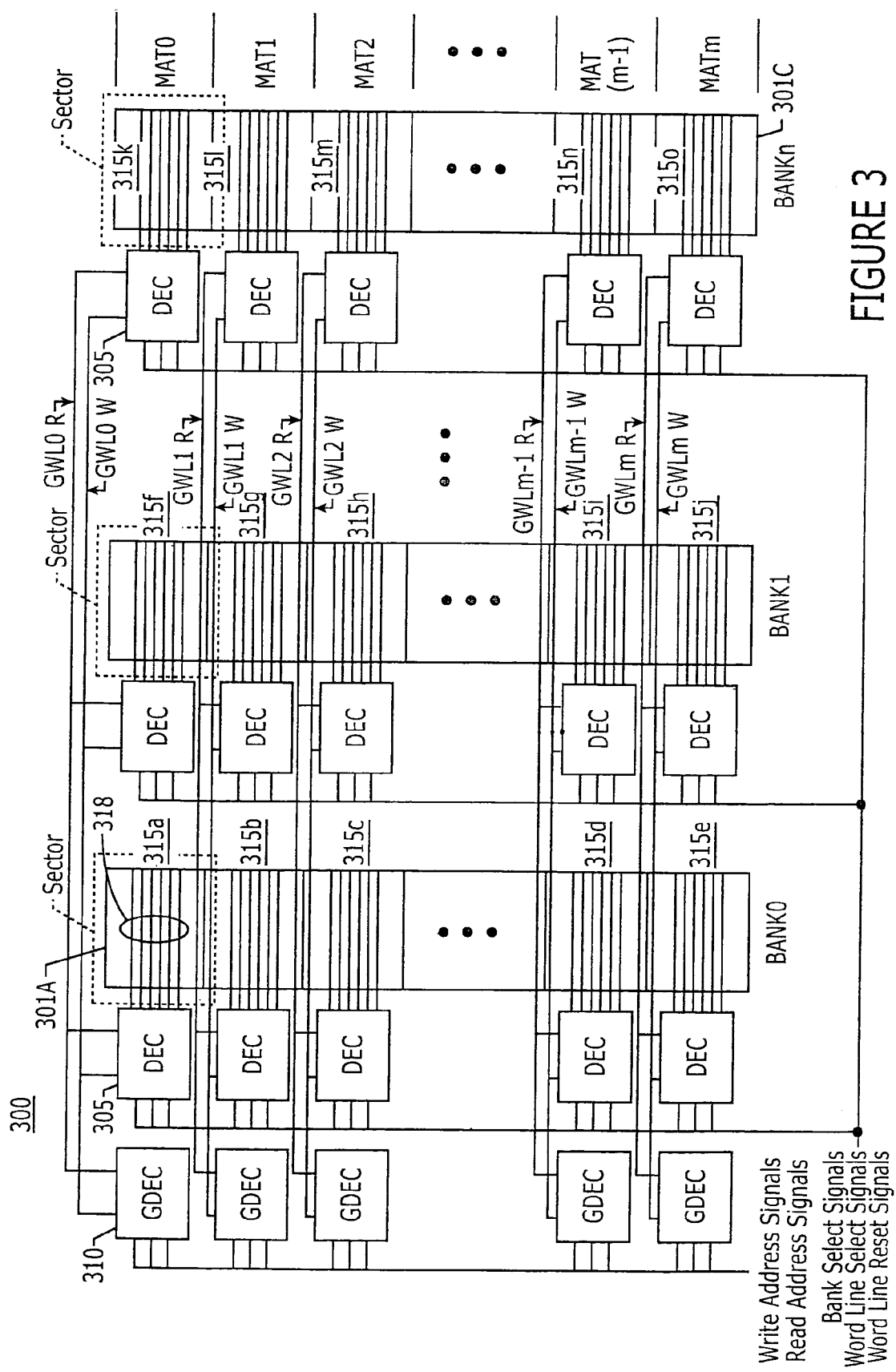
FIG. 3 is a block diagram that illustrates embodiment of multi-bank flash memory devices according to the invention.

FIG. 3 is a block diagram that illustrates embodiments of multi-bank flash memory devices having read-while-write capability according to the invention. A multi-bank flash memory device 300 includes a plurality of banks 301A–301C that are organized as sectors. In particular, each of the banks 301A–301C is defined to include sectors 315a–e, 315f–j, and 315k–o, respectively. Each of the sectors in the banks is coupled to an associated local row decoder circuit 305 by a plurality of word lines coupled to memory cells within the sectors. For example, as shown in FIG. 3, the local row decoder circuit 305 is coupled to the sector 315a by a plurality of word lines 318.

Selected ones of the local row decoder circuits 305 are coupled to ones of global row decoder circuits 310 by separate global read and write control lines that conduct global read and write control signals to the selected ones of the local row decoder circuits 305. The sectors that operate under the control of the global row decoder circuit 310 (via the respective local row decoder circuit coupled thereto) are organized into MAT portions of the respective banks of the flash memory.

When the global read and write control signals are made active, a read or write operation is to be carried out in at least one of the sectors to which the selected local row decoder circuits 305 are coupled. Therefore, the local row decoder circuits 305 operate under the control of the global row decoder circuit 310. For example, a write operation that is addressed to memory cells in sector 315a is carried out via local row decoder circuit 305 under the control of the global row decoder circuit 310 by asserting the global write control signal to all of the local row decoder circuits 305 coupled top the global write control line. However, because the address signals provided for the write operation do not identify memory cells located within sectors 315f or 315k, the write operation is not carried out in those sectors. Accordingly, when, for example, a write operation is to be performed to memory cells located in a sector of the flash memory under the control of the global row decoder circuit, the write operation will be carried in one of the sectors included in the MAT portion associated with the global row decoder circuit.

It will understood that multi-bank flash memory devices according to the invention have read-while-write capability, wherein a read operation can be performed in one of the sectors in an MAT portion of the flash memory while a write operation is simultaneously performed in another sector within the same MAT portion. For example, according to FIG. 3, a read operation can be performed in section 315a while a write operation is simultaneously performed in section 315k under the control of the global row decoder circuit 310. It will further be understood that the different MAT portions of the multi-bank flash memory device 300 can operate independently from one another. For example, a write operation can be performed in a sector included in a first one of the MAT portions while a second write operation is performed in a sector included in a second MAT portion of the flash memory device. It will also be understood that FIG. 3 illustrates a variable number N of banks of flash memory. The banks can be further organized into a variable number m of MAT portions. Each of the m MAT portions of the banks has an associated global row decoder circuit 310 that controls the operation of the local row decoder circuits 305 associated with each of the sectors include in the m MAT portions.

Figure 4:
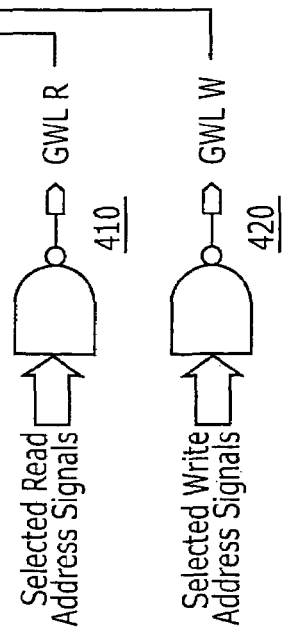
FIG. 4 is a schematic diagram that illustrates embodiments of global row decoder circuits according to the invention.

FIG. 4 is a schematic diagram illustrating embodiments of combinatorial logic circuits included in global row decoder circuits according to the invention. In particular, the global row decoder circuit 400 includes separate combinatorial logic circuits 410 and 420 that generate separate read and write control signals respectively. The combinatorial logic circuit 410 is responsive to selected read address signals to provide the global read control signal to the local row decoder circuits that operate under the control of the global row decoder circuit 400. The combinatorial logic circuit 420 is responsive to selected write address signals to provide the global write control signal to the local row decoder circuits that operate under the control of the global row decoder circuit 400.

It will be understood that the selected read and write address signals can be selected based on the address mapping of the multi-bank flash memory device. In particular, as shown in FIG. 3, each of the global row decoder circuits 310 receives read and write address signals and is configured to determine whether the address signals provided thereto correspond to memory locations that are coupled to the local row decoder circuits 305 that operate under the global row decoder circuit's 310 control. Moreover, the read and write address signals that are selectively provided to the combinatorial logic circuits included in the remaining global row decoder circuits can be different based on which of the sectors of the flash memory device are to be accessed via the remaining global row decoder circuits. In some embodiments according to the invention, the combinatorial logic circuits can be NAND logic circuits (or gates) as shown in FIG. 4. In other embodiments according to the invention, the combinatorial logic circuits can be logical NOR gates. Other types of combinatorial logic circuits may be used.

Figure 5:
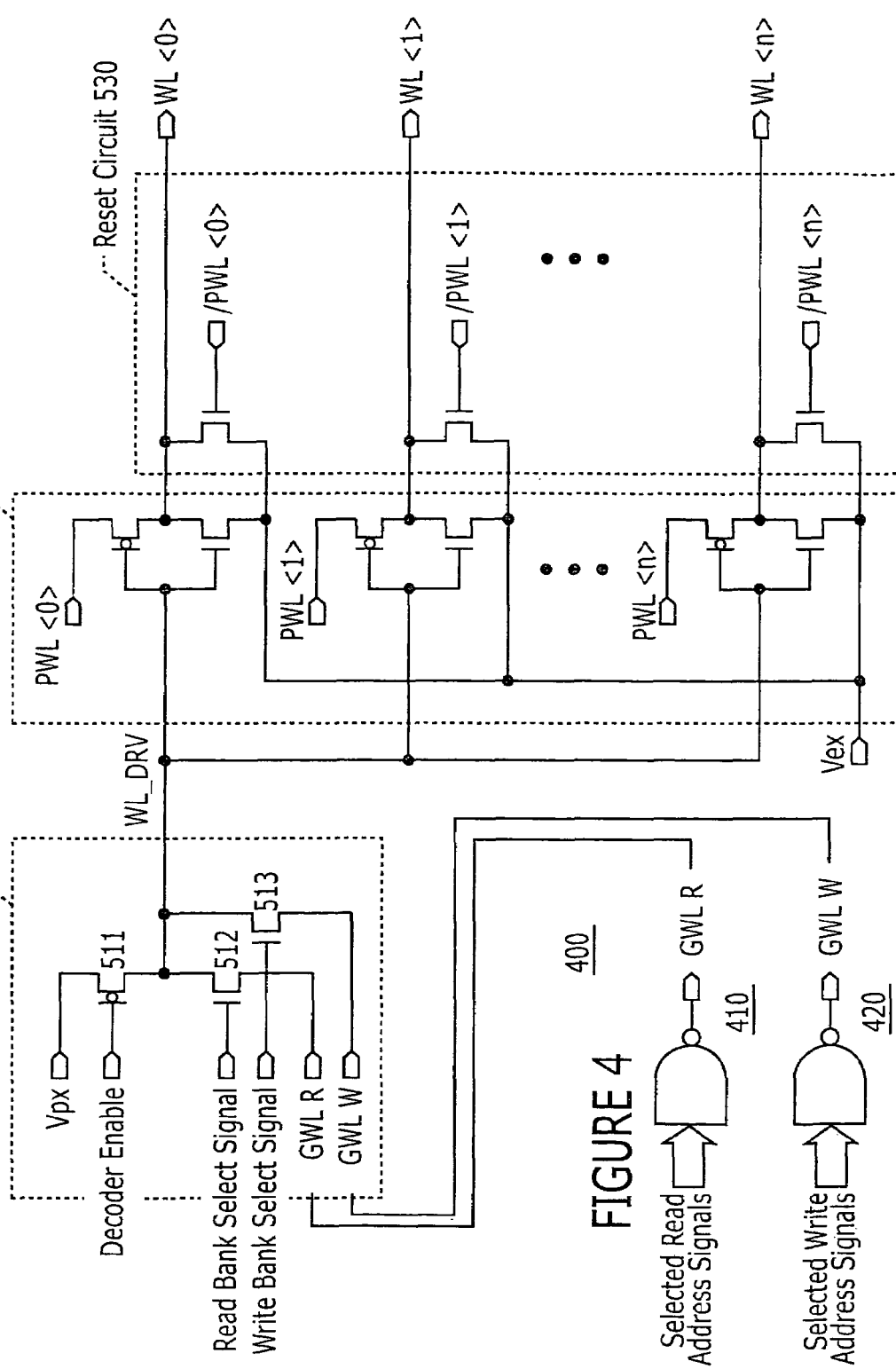
FIG. 5 is a schematic diagram that illustrates embodiments of local row decoder circuits according to the invention.

FIG. 5 is a schematic diagram that illustrates embodiments of bank select circuits according to the invention. In particular, a bank select circuit 510 includes pass transistors 512 and 513 that can be made conductive (i.e., turned on) responsive to separate read and write bank select signals, respectively. The pass transistors 512 and 513 can be turned on to pass the global read and write control signals GWL R and GWL W, respectively, to a word line driver line as a word line driver signal WL DRV. According to FIG. 5, a transistor 511 can be made non-conductive (i.e., turned off) responsive to a high going decoder enable signal to buffer the word line driver signal WL DRV from a supply voltage $V_{PX}$. The supply voltage $V_{PX}$ can otherwise be used to provide an initialization voltage on the word line driver line prior to or subsequent to a memory operation.

The separate read or write control signals are provided to a word line driver circuit 520 that enables a selected word line WL coupled to the sector associated with the local row decoder circuit 510. The word line driver circuit 520 further includes a plurality of sections that each drive one of the word lines coupled to memory cells in the sector. Each of the sections includes a totem pole arrangement, of upper and lower transistors, that drives the associated word line WL. The word line WL to be driven by the word line driver circuit 520 is selected based on a set of word line select signals that are provided to each of the sections of the word line driver circuit 520. A reset circuit 530 is coupled to each of the word lines WL driven by sections of the word line driver circuit 520 and operates to reset the voltage on each of the word lines WL prior or subsequent to a memory operation based on a word line reset signal, which can, in some embodiments according to the invention, be an inverted form of the word select signals.

The word line select signals indicate which of the totem pole circuits included in sections of the word line driver circuit 520 is to drive the associated word line WL. For example, each of the totem pole circuits included in the word line driver circuit 520 receives the read or write control signal provided by the bank select circuit 510. The read or write control signal causes each of the upper transistors in the totem pole circuits to become conductive, thereby passing the respective word line select signal PWL that is coupled to the totem pole circuit to the associated word line WL. Therefore, each of the totem pole circuits passes the associated word line select signal to the word line WL at the output of the totem pole circuit to activate the word line selected by the word line select signals.

It will be understood that although the above discussion refers to word lines, word line select signals, and word line reset signals in general, embodiments according to the invention may utilize a plurality of these signals. For example, in some embodiments according to the invention, eight word lines are coupled to each sector. Such embodiments can, therefore, utilize eight word line select signals and eight word line reset signals. Other numbers of word lines, word line select signals, and word line reset signals can be utilized in embodiments according to the invention.

Figure 6:
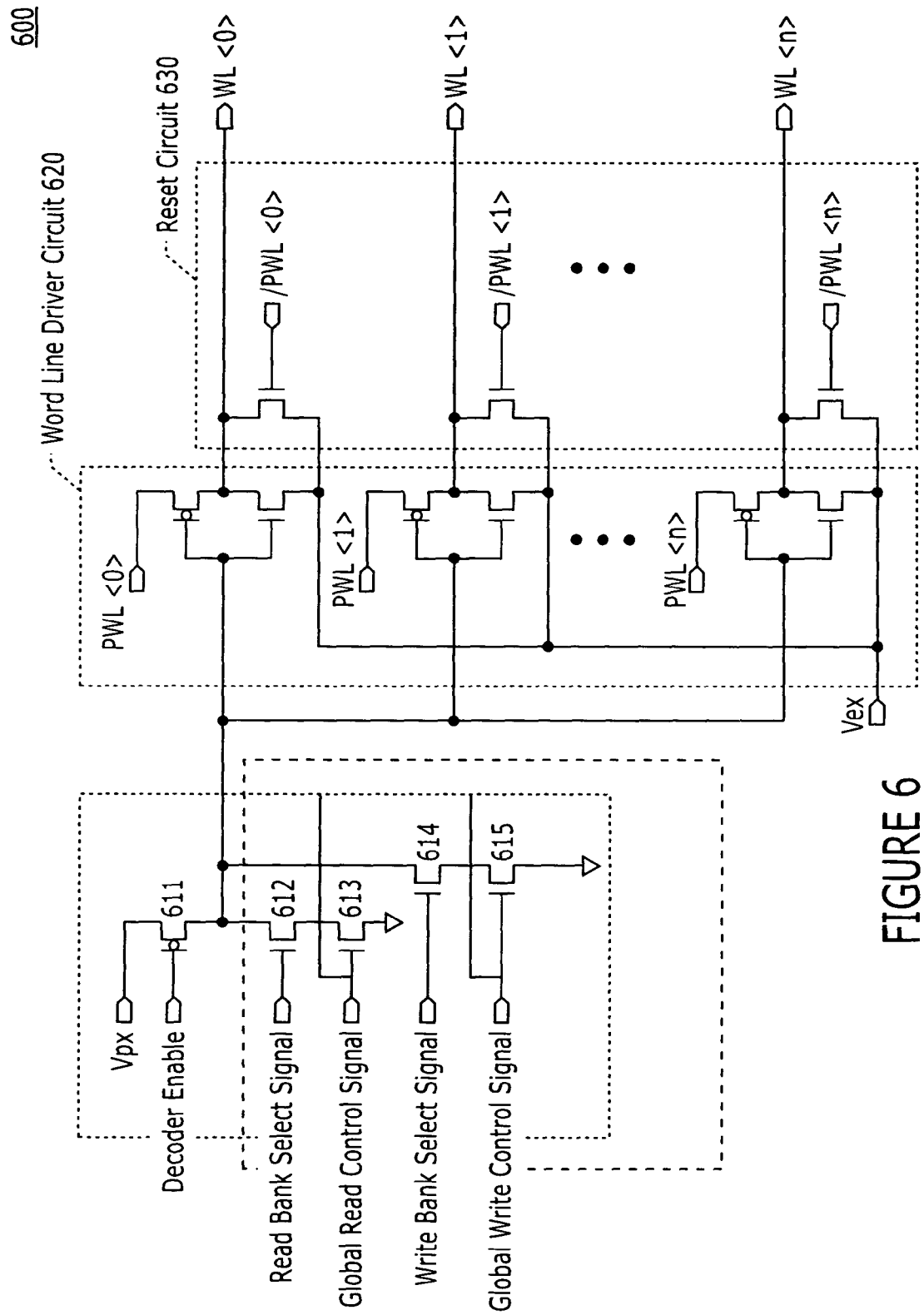
FIG. 6 is a schematic diagram that illustrates embodiments of local row decoder circuits according to the invention.

FIG. 6 is a circuit diagram illustrating embodiments of local row decoder circuits according to the invention. In particular, a local row decoder circuit 600 includes a totem pole arrangement of transistors for each of the separate read and write control signals provided to a word line driver circuit 620. The totem pole arrangement includes upper and lower transistors 612 and 613, respectively, and is responsive to a read bank select signal to pass the read control signal to the word line drive circuit 620 during a read operation. The totem pole arrangement of transistors 614 and 615 operates in response to a write bank select signal that causes transistor 614 to become conductive to pass the write control signal to the word line driver circuit 620 during a write operation. As discussed above in reference to FIGS. 4 and 5, the word line driver circuit 620 drives the word line WL that is selected by the word line select signals. The local row decoder circuit 600 further includes a reset circuit 630 that can be used to reset the voltage on each of the word lines WL responsive to a word line reset signal, which can in some embodiments according to the invention, be an inverted version of the word line select signals. According to FIG. 6, a transistor 611 can be made non-conductive (i.e., turned off) responsive to a high going decoder enable signal to buffer the word line driver signal from a supply voltage $V_{PX}$.

As discussed above, embodiments according to the invention can provide local row decoder circuits that are free of combinatorial type logic circuits that otherwise may occupy large areas in each of the local row decoder circuits as characterized in the prior art. The combinatorial type logic circuits used to provide address decoding is instead included in the global row decoder circuit that controls selected ones of the local row decoder circuits using separate read and write control lines provided thereto. Accordingly, the combinatorial type logic circuits that occupy large areas can be located in the global row decoder circuit that controls multiple ones of the row decoder circuits that are coupled to sectors of the flash memory.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A flash memory comprising:
   a local row decoder circuit configured to drive word lines coupled to a bank of a flash memory responsive to separate read and write control signals provided thereto from outside the local row decoder circuit; and
   a global row decoder circuit, coupled to the local row decoder circuit via the separate read and write control signals, and configured to activate the separate read and write control signals based on an address provided to the global row decoder circuit that indicates memory cells associated with the address are accessed using the word lines.

2. A flash memory according to claim 1 wherein the local row decoder circuit comprises a first local row decoder circuit, the bank comprises a first bank, and the word lines comprise first word lines, the flash memory further comprising:
   a second local row decoder circuit configured drive to a second bank of the flash memory, separate from the first bank, via second word lines that are separate from the first word lines, wherein the second local row decoder circuit is coupled to the global decoder circuit by the separate read and write control signals.

3. A flash memory according to claim 2 wherein the global row decoder circuit is configured to activate the first and second local row decoder circuits using the separate read and write control signals.

4. A flash memory according to claim 2 wherein the global row decoder circuit comprises:
   a read address decoder circuit configured to activate the read control signal coupled to the first and second separate banks based on a read address provided thereto; and
   a write address decoder circuit configured to activate the write control signal coupled to the first and second separate banks based on a write address provided thereto.

5. A flash memory according to claim 1 wherein the local row decoder circuit and the global row decoder circuit are spaced apart within the flash memory.

6. A flash memory according to claim 1 wherein the local row decoder circuit comprises first and second bank select circuits configured to pass the separate read and write control signals to a plurality of word line drivers coupled to a sector within the bank.

7. A flash memory according to claim 6 wherein the first and second bank select circuits comprise at least one totem-pole arrangement of first and second transistors wherein the first and second transistors are conductive to pass at least one of the separate read and write control signals to the plurality of word line drivers associated with the sector responsive to at least one select signal that indicates the local row decoder circuit is coupled to the bank that includes a memory location corresponding to a write or read address provided to the global decoder circuit.

8. A flash memory according to claim 6 wherein the first and second bank select circuits comprise at least one pass transistor configured to pass at least one of the separate read and write control signals to the plurality of word line drivers responsive to at least one bank select signal that indicates that the bank to which the local row decoder circuit is coupled includes a memory location corresponding to an address provided to the flash memory.

9. A flash memory according to claim 1 wherein the global row decoder circuit comprises first and second NAND combinatorial logic circuits or first and second NOR combinatorial logic circuits configured to provide the separate read and write control signals.

10. A flash memory according to claim 9 wherein the first and second NAND combinatorial logic circuits or the first and second NOR combinatorial logic circuits are configured to activate responsive to a read address for a read operation or a write address for a write operation respectively.

11. A flash memory according to claim 1 wherein the bank comprises a first bank, wherein the flash memory has read-while-write capability comprising an ability to perform a write operation in the first bank of the flash memory via the first local row decoder circuit while simultaneously performing a read operation in a second bank of the flash memory via another local row decoder circuit.

12. A flash memory according to claim 1 wherein the flash memory has read-while-write capability comprising an ability to perform a first read or write operation in a first sector of the bank while simultaneously performing a second read or write operation in a second sector of the bank that is separate from the first sector via another local row decoder circuit.

13. A flash memory comprising:
a local row decoder circuit configured to drive word lines coupled to a bank of a flash memory responsive to separate read and write control signals provided thereto from outside the local row decoder circuit, wherein the bank of flash memory comprises a first bank of the flash memory configured to perform a write operation addressed to the first bank via the local row decoder circuit, the flash memory farther comprising:
a second bank of the flash memory configured to perform a read operation addressed thereto via a second local row decoder circuit simultaneous with the write operation.

14. A flash memory having read-while-write capability comprising:
a plurality of banks of a flash memory;
a plurality of local row decoder circuits configured to drive a plurality of word lines coupled to a respective sector in each of the plurality of banks; and a global row decoder circuit configured to provide separate write and read control signals to each of the plurality of local row decoder circuits to enable a read operation in a first sector in one of the plurality of banks and enable a write operation in a second sector in another of the plurality of banks simultaneous with the read operation.

15. A flash memory according to claim 14 wherein the global row decoder circuit is coupled to the plurality of local row decoder circuits via the separate read and write control signals, and configured to determine whether to activate the separate read and write control signals based on an address for the read or write operation provided to the global row decoder circuit.

16. A flash memory according to claim 15 wherein the global row decoder circuit comprises:
a read address decoder circuit configured to activate the read control signal coupled to the first and second separate banks based on a read address provided thereto; and
a write address decoder circuit configured to activate the write control signal coupled to the first and second separate banks based on a write address provided thereto.

17. A flash memory according to claim 16 wherein the read address decoder circuit and the write address decoder circuit are configured to be active simultaneously.

18. A flash memory according to claim 15 wherein the bank comprises a first bank, wherein the flash memory has read-while-write capability comprising an ability to perform a write operation in the first bank of the flash memory via the first local row decoder circuit while simultaneously performing a read operation in a second bank of the flash memory via another local row decoder circuit.

19. A flash memory according to claim 15 wherein the flash memory has read-while-write capability comprising an ability to perform a first read or write operation in a first sector of the bank while simultaneously performing a second read or write operation in a second sector of the bank that is separate from the first sector via another local row decoder circuit.

20. A flash memory according to claim 14 wherein the plurality of local row decoder circuits and the global row decoder circuit are spaced apart within the flash memory.

21. A flash memory according to claim 20 wherein the global row decoder circuit comprises first and second NAND combinatorial logic circuits or first and second NOR combinatorial logic circuits configured to provide the separate read and write control signals.

22. A flash memory according to claim 21 wherein the first and second NAND combinatorial logic circuits or the first and second NOR combinatorial logic circuits are configured to activate responsive to a read address for a read operation or a write address for a write operation respectively.

23. A flash memory according to claim 14 wherein the local row decoder circuit comprises first and second bank select circuits configured to pass the separate read and write control signals to a plurality of word line drivers coupled to a sector within the bank.

24. A flash memory according to claim 23 wherein the first and second bank select circuits comprise at least one totem-pole arrangement of first and second transistors wherein the first and second transistors are conductive to pass at least one of the separate read and write control signals to the plurality of word line drivers associated with the sector responsive to at least one select signal that indicates the local row decoder circuit is coupled to the bank that includes a memory location corresponding to a write or read address provided to the global decoder circuit.

25. A flash memory according to claim 23 wherein the first and second bank select circuits comprise at least one pass transistor configured to pass at least one of the separate read and write control signals to the plurality of word line drivers responsive to at least one bank select signal that indicates that the bank to which the local row decoder circuit is coupled includes a memory location corresponding to an address provided to the flash memory.

26. A flash memory according to claim 14 wherein the bank of flash memory comprises a first bank of the flash memory configured to perform a write operation addressed to the first bank via the local row decoder circuit, the flash memory further comprising:

a second bank of the flash memory configured to perform a read operation addressed thereto via a second local row decoder circuit simultaneous with the write operation.

* * * * *